United States Patent
Furuya et al.

(10) Patent No.: US 10,036,958 B2
(45) Date of Patent: Jul. 31, 2018

(54) LIGHT IRRADIATION APPARATUS AND DRAWING APPARATUS

(71) Applicant: SCREEN Holdings Co., Ltd., Kyoto (JP)

(72) Inventors: Yoshio Furuya, Kyoto (JP); Masahiko Kokubo, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/737,988

(22) Filed: Jun. 12, 2015

(65) Prior Publication Data
US 2015/0370173 A1    Dec. 24, 2015

(30) Foreign Application Priority Data

Jun. 19, 2014 (JP) ............................. P2014-126372
Apr. 30, 2015 (JP) ............................. P2015-093302

(51) Int. Cl.
*G03B 27/54* (2006.01)
*G03F 7/20* (2006.01)
(Continued)

(52) U.S. Cl.
CPC ..... *G03F 7/70191* (2013.01); *G02B 19/0052* (2013.01); *G02B 27/0905* (2013.01);
(Continued)

(58) Field of Classification Search
CPC .............. G03F 7/7008; G03F 7/70025; G03F 7/70041; G03F 7/7005; G03F 7/70075;
(Continued)

(56) References Cited

U.S. PATENT DOCUMENTS

| 4,619,508 A | * | 10/1986 | Shibuya | ............... | G02B 3/0056 |
| | | | | | 353/122 |
| 4,918,583 A | | 4/1990 | Kudo et al. | ................... | 362/268 |

(Continued)

FOREIGN PATENT DOCUMENTS

| CN | 101976020 A | 2/2011 |
| JP | 7-248462 | 9/1995 |

(Continued)

OTHER PUBLICATIONS

English translation of JP 07-248462, published Sep. 26, 1995.*

(Continued)

*Primary Examiner* — Christina Riddle
(74) *Attorney, Agent, or Firm* — Ostrolenk Faber LLP

(57) ABSTRACT

Laser light from a light source part is guided to an irradiation plane by an irradiation optical system including element lenses and transparent parts. Light fluxes having passed through the element lenses respectively enter the transparent parts. A light condensing part superimposes irradiation regions of the light fluxes on the irradiation plane. When viewed in the arrangement direction of the element lenses, the light fluxes regarded as parallel light enter the light condensing part which includes a diverging lens for causing the parallel light to diverge in a Y direction perpendicular to the arrangement direction, and a converging lens for causing the light from the diverging lens to converge on the irradiation plane. This configuration readily achieves a design where the focal length of the light condensing part regarding the Y direction is reduced, and suppresses shifts in light condensing positions of the light fluxes on the irradiation plane.

6 Claims, 10 Drawing Sheets

(51) Int. Cl.
*G02B 27/09* (2006.01)
*G02B 19/00* (2006.01)

(52) U.S. Cl.
CPC ..... *G02B 27/0927* (2013.01); *G02B 27/0966* (2013.01); *G03F 7/70058* (2013.01); *G03F 7/70075* (2013.01); *G03F 7/70091* (2013.01); *G02B 27/0911* (2013.01)

(58) Field of Classification Search
CPC ............. G03F 7/70091; G03F 7/70291; G03F 7/70191; G02B 19/0019; G02B 19/0047; G02B 19/0057; G02B 19/066; G02B 3/0043; G02B 3/005
USPC .............. 355/52, 53, 55, 67–71, 75–77; 250/492.1, 492.2, 492.21, 492.22, 493.1, 250/548; 362/553, 558; 359/619, 486.01
See application file for complete search history.

(56) References Cited

U.S. PATENT DOCUMENTS

| | | | | |
|---|---|---|---|---|
| 6,312,134 | B1 * | 11/2001 | Jain | G03F 7/70291 355/35 |
| 6,577,429 | B1 | 6/2003 | Kurtz et al. | 359/279 |
| 7,413,311 | B2 * | 8/2008 | Govorkov | G02B 26/0808 348/E9.026 |
| 2006/0132725 | A1 | 6/2006 | Terada et al. | 353/102 |
| 2011/0086441 | A1 | 4/2011 | Kawaguchi et al. | 438/7 |
| 2012/0080411 | A1 * | 4/2012 | Mizuyama | G02B 27/286 219/121.6 |

FOREIGN PATENT DOCUMENTS

| | | | |
|---|---|---|---|
| JP | 2004-012757 | 1/2004 | |
| JP | 2004-206004 | 7/2004 | |
| JP | 2006-049656 | 2/2006 | |
| JP | WO 2006013814 A1 * | 2/2006 | ......... B23K 26/0604 |
| KR | 10-2011-0004437 | 1/2011 | |
| TW | 201303959 A1 | 1/2013 | |

OTHER PUBLICATIONS

English translation of WO2006/013814, published Feb. 9, 2006.*
Extended European Search Report dated Nov. 17, 2015 in corresponding European Patent Application No. 15 171 300.5.

* cited by examiner

LIGHT IRRADIATION APPARATUS AND DRAWING APPARATUS

TECHNICAL FIELD

The present invention relates to a light irradiation apparatus and a drawing apparatus.

BACKGROUND ART

Technologies for uniformly irradiating a predetermined plane with laser light emitted from a light source such as a semiconductor laser have conventionally been proposed. For example, in a light irradiation apparatus in which a plurality of cylindrical lenses in a cylindrical lens array divide laser light incident from a light source part into a plurality of light fluxes and another lens superimposes irradiation regions of the light fluxes on one another on an irradiation plane, an optical path length difference generation part is provided between the light source part and the cylindrical lens array. The optical path length difference generation part includes a plurality of transparent parts that produce differences in optical path length among them that are longer than the coherence length (coherence distance) of the laser light, and light that has passed through the plurality of transparent parts respectively enters the plurality of cylindrical lenses. This prevents interference fringes from appearing and achieves uniformity of the intensity distribution of illumination light that is emitted onto the irradiation plane (see, for example, Japanese Patent Application Laid-Open No. 2004-12757 as one example of such an apparatus).

The above-described light irradiation apparatus is provided with a light condensing part that, in the case of making a linear cross section of light on the irradiation plane, causes the plurality of light fluxes to converge on the same position of the irradiation plane when viewed in the direction of arrangement of the cylindrical lenses. However, in the case where parallelism of the entrance and exit surfaces of the transparent part varies among the transparent parts or parallelism of the entrance and exit surfaces of the cylindrical lens varies among the cylindrical lenses when viewed in the above direction of arrangement, the light condensing positions of the plurality of light fluxes on the irradiation plane will be shifted from one another in a direction perpendicular to the arrangement direction. Such shifts in the light condensing positions of the light fluxes reduce the quality of illumination light and, for example, with a drawing apparatus that uses the light irradiation apparatus, reduce the accuracy of pattern drawing.

SUMMARY OF INVENTION

The present invention is intended for a light irradiation apparatus, and it is an object of the present invention to suppress shifts in the light condensing positions of a plurality of light fluxes on an irradiation plane.

A light irradiation apparatus according to the present invention includes a light source part for emitting laser light toward a predetermined position, and an irradiation optical system disposed at the predetermined position and for guiding the laser light from the light source part along an optical axis to an irradiation plane. The irradiation optical system includes a division lens part having a plurality of element lenses arranged in a first direction perpendicular to the optical axis, and for using the plurality of element lenses to divide incident light into a plurality of light fluxes, and a light condensing part disposed between the division lens part and the irradiation plane and for superimposing irradiation regions of the plurality of light fluxes on each other on the irradiation plane. The plurality of element lenses are a plurality of cylindrical lenses that have no power in a second direction perpendicular to the optical axis and the first direction, or the irradiation optical system includes a plurality of transparent parts arranged in the first direction and having different optical path lengths and light fluxes that have passed through the plurality of element lenses or light fluxes that travel toward the plurality of element lenses are respectively incident on the plurality of transparent parts. The plurality of light fluxes enter the light condensing part as parallel light when viewed in the first direction, and the light condensing part causes the plurality of light fluxes to converge on the irradiation plane. The light condensing part includes a diverging part for causing the parallel light to diverge in the second direction, and a converging lens on which light from the diverging part is incident and that causes the light to converge on the irradiation plane when viewed in the first direction.

The above-described light irradiation apparatus can readily achieve a design in which the focal length of the light condensing part with respect to the second direction is reduced and consequently can suppress shifts in the light condensing positions of the plurality of light fluxes on the irradiation plane.

Preferably, the diverging part is a cylindrical lens having negative power in only the second direction.

Another light irradiation apparatus according to the present invention includes a light source part for emitting laser light toward a predetermined position, and an irradiation optical system disposed at the predetermined position and for guiding the laser light from the light source part along an optical axis to an irradiation plane. The irradiation optical system includes a division lens part having a plurality of element lenses arranged in a first direction perpendicular to the optical axis, and for using the plurality of element lenses to divide incident light into a plurality of light fluxes, and a light condensing part disposed between the division lens part and the irradiation plane and for superimposing irradiation regions of the plurality of light fluxes on each other on the irradiation plane. The plurality of element lenses are a plurality of cylindrical lenses that have no power in a second direction perpendicular to the optical axis and the first direction, or the irradiation optical system includes a plurality of transparent parts arranged in the first direction and having different optical path lengths and light fluxes that have passed through the plurality of element lenses or light fluxes that travel toward the plurality of element lenses are respectively incident on the plurality of transparent parts. The plurality of light fluxes enter the light condensing part as parallel light when viewed in the first direction, and the light condensing part causes the plurality of light fluxes to converge on the irradiation plane. Collimated laser light is incident on the irradiation optical system from the light source part. The irradiation optical system further includes a width adjustment part for making a width, in the second direction, of the parallel light incident on the light condensing part smaller than a width, in the second direction, of the collimated laser light when viewed in the first direction.

The above-described light irradiation apparatus can also readily achieve a design in which the focal length of the light condensing part with respect to the second direction is reduced and consequently can suppress shifts in the light condensing positions of the plurality of light fluxes on the irradiation plane.

Preferably, each of the plurality of element lenses of the division lens part has a spherical lens surface, and the lens surface serves as part of the width adjustment part.

The present invention is also intended for a drawing apparatus. The drawing apparatus according to the present invention includes the above-described light irradiation apparatus, a spatial light modulator disposed on the irradiation plane of the light irradiation apparatus, a projection optical system for guiding spatially modulated light emitted from the spatial light modulator onto an object, a movement mechanism for moving an irradiation position to be irradiated with the spatially modulated light on the object, and a control part for controlling the spatial light modulator in synchronization with the movement of the irradiation position by the movement mechanism.

These and other objects, features, aspects and advantages of the present invention will become more apparent from the following detailed description of the present invention when taken in conjunction with the accompanying drawings.

DESCRIPTION OF EMBODIMENTS

Figure 1:
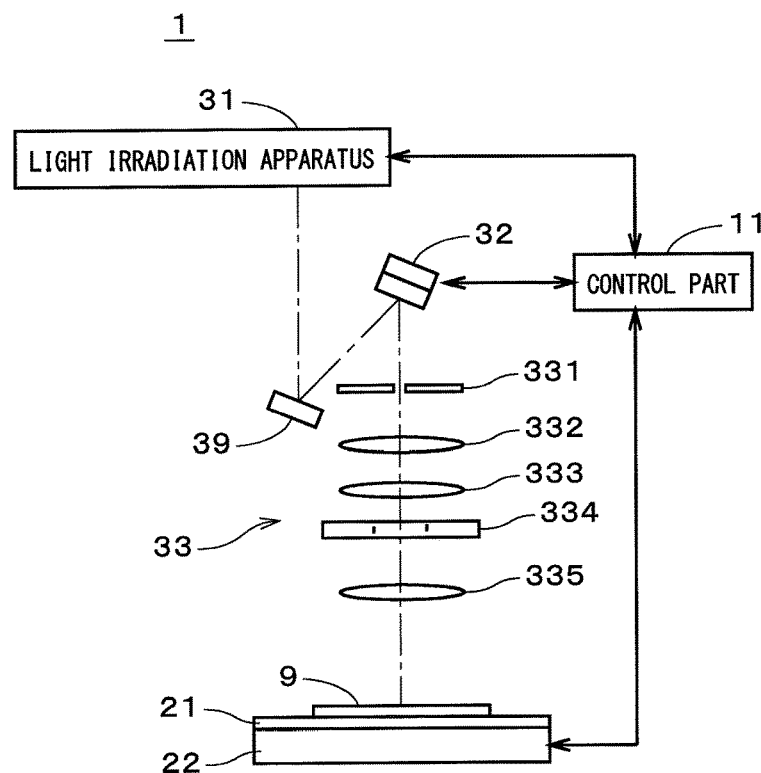
FIG. 1 illustrates a configuration of a drawing apparatus.

FIG. 1 illustrates a configuration of a drawing apparatus 1 according to an embodiment of the present invention. The drawing apparatus 1 is a direct drawing apparatus for drawing a pattern by irradiating a surface of a substrate 9 such as a semiconductor substrate or a glass substrate, to which a photosensitive material is applied, with light beams. The drawing apparatus 1 includes a stage 21, a movement mechanism 22, a light irradiation apparatus 31, a spatial light modulator 32, a projection optical system 33, and a control part 11. The stage 21 holds the substrate 9, and the movement mechanism 22 moves the stage 21 along a main surface of the substrate 9. The movement mechanism 22 may rotate the substrate 9 about an axis perpendicular to the main surface.

The light irradiation apparatus 31 irradiates the spatial light modulator 32 with linear light (light having a linear cross section) via a mirror 39. The details of the light irradiation apparatus 31 will be described later. The spatial light modulator 32 is of, for example, a diffraction grating type as well as a reflection type, and is a diffraction grating whose grating depth can be changed. The spatial light modulator 32 is manufactured using semiconductor device manufacturing technologies. The diffraction grating type light modulator used in the present embodiment is, for example, GLV (Grating Light Valve), which is a registered trademark of Silicon Light Machines, Sunnyvale, Calif. The spatial light modulator 32 includes a plurality of grating elements arranged in a row, and each grating element transitions between a state in which first-order diffraction light is emitted and a state in which zero-order diffraction light (zero-order light) is emitted. Thus, spatially modulated light is emitted from the spatial light modulator 32.

The projection optical system 33 includes a douser 331, a lens 332, a lens 333, an aperture plate 334, and a focusing lens 335. The douser 331 blocks off ghost light and part of high-order diffraction light, and passes the light emitted from the spatial light modulator 32. The lenses 332 and 333 constitute a zoom part. The aperture plate 334 blocks off plus and minus first-order diffraction light (and high-order diffraction light), and passes zero-order diffraction light. The light that has passed through the aperture plate 334 is guided onto the main surface of the substrate 9 by the focusing lens 335. In this way, the projection optical system 33 guides the spatially modulated light of the spatial light modulator 32 onto the substrate 9.

The control part 11 is connected to and controls the light irradiation apparatus 31, the spatial light modulator 32, and the movement mechanism 22. In the drawing apparatus 1, the movement mechanism 22 moves the stage 21 to move an irradiation position to be irradiated with the light emitted from the spatial light modulator 32 on the substrate 9. The control part 11 also controls the spatial light modulator 32 in synchronization with the movement of the irradiation position by the movement mechanism 22. Accordingly, a desired pattern is drawn on the photosensitive material of the substrate 9.

Figure 2:
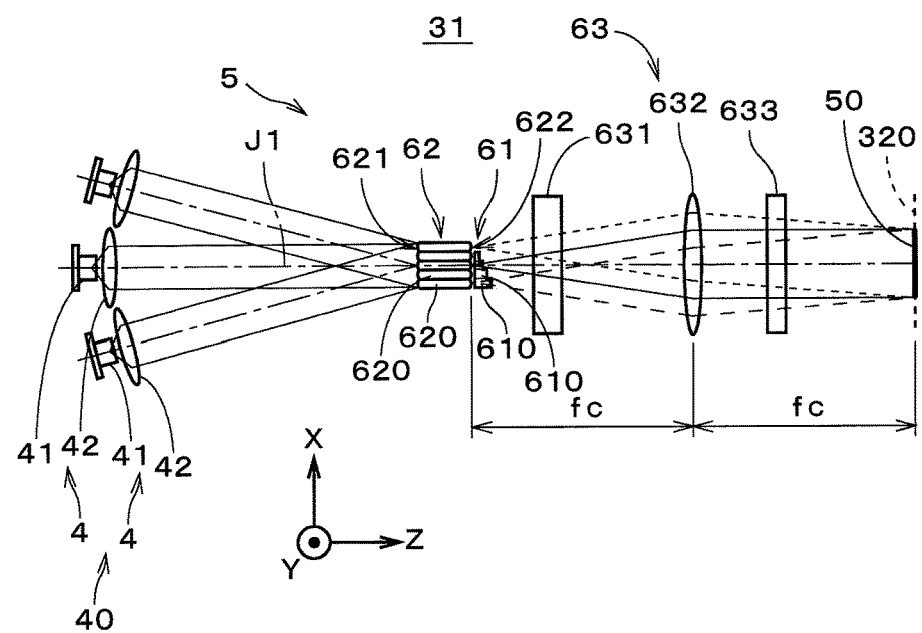
FIG. 2 illustrates a configuration of a light irradiation apparatus.
Figure 3:
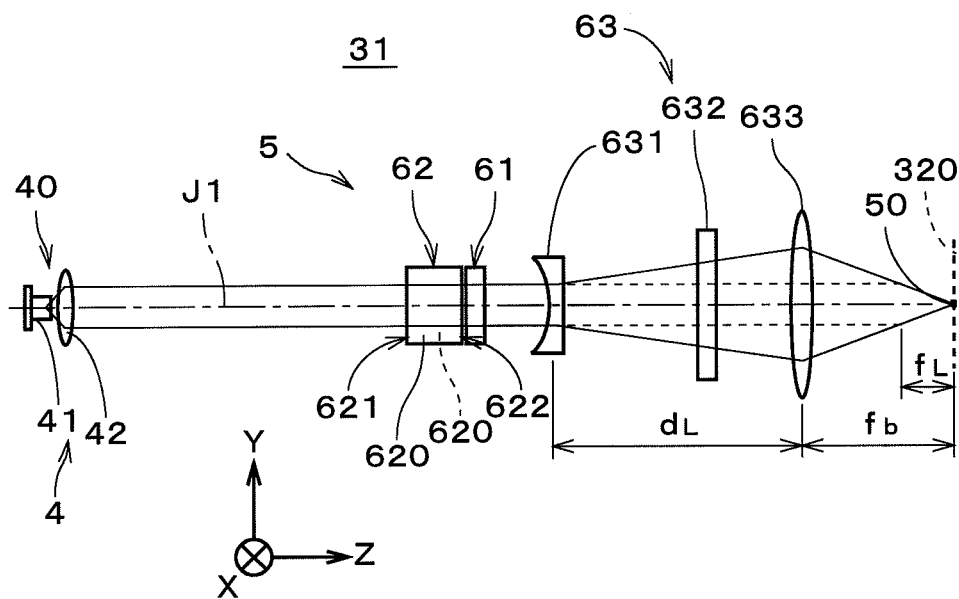
FIG. 3 illustrates a configuration of the light irradiation apparatus.

FIGS. 2 and 3 illustrate a configuration of the light irradiation apparatus 31. In FIGS. 2 and 3, a direction parallel to an optical axis J1 of an irradiation optical system 5, which will be described later, is shown as a Z direction, and directions perpendicular to the Z direction and orthogonal to each other are shown as X and Y directions (the same applies below). FIG. 2 illustrates the configuration of the light irradiation apparatus 31 when viewed in (along) the Y direction, and FIG. 3 illustrates the configuration of the light irradiation apparatus 31 when viewed in the X direction.

The light irradiation apparatus 31 in FIGS. 2 and 3 includes a light source unit 40 and the irradiation optical system 5. The light source unit 40 includes a plurality of light source parts 4, and each light source part 4 includes a single light source 41 (e.g., a semiconductor laser) and a single collimating lens 42. The light sources 41 of the light source parts 4 are arranged in approximately the X direction on a plane (hereinafter, referred to as a "light source arrangement plane") parallel to a ZX plane. Laser light emitted from each light source 41 is collimated by the collimating lens 42 and enters the irradiation optical system 5. In the light source unit 40, the light source parts 4 arranged on the light source arrangement plane emit laser light from different directions along the light source arrangement plane toward the same position (a division lens part 62 described later) on the irradiation optical system 5.

The irradiation optical system 5 is disposed at the irradiation position to be irradiated with the laser light emitted from the light source parts 4. The irradiation optical system 5 guides the laser light along the optical axis J1 to the surface of the spatial light modulator 32, which is an irradiation plane indicated by the broken line 320 in FIGS. 2 and 3, i.e., to the surfaces of the plurality of grating elements. In actuality, the light irradiation apparatus 31 includes the mirror 39 as a constituent element since, as described previously, the light from the light irradiation apparatus 31 is emitted onto the spatial light modulator 32 via the mirror 39. However, for convenience of illustration, the mirror 39 is omitted from FIGS. 2 and 3 (the same applies below).

The irradiation optical system 5 includes an optical path length difference generation part 61, the division lens part 62, and a light condensing part 63. In the irradiation optical system 5, the division lens part 62, the optical path length difference generation part 61, and the light condensing part 63 are arranged in this order along the optical axis J1 from the light source unit 40 toward the irradiation plane 320. The collimated laser light from the light source parts 4 enters the division lens part 62.

Figure 4:
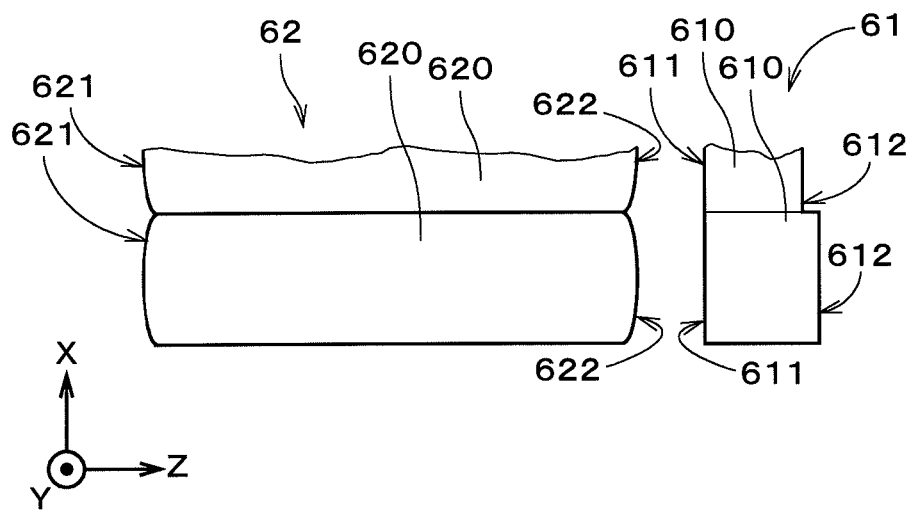
FIG. 4 is a partial enlarged view of a division lens part and an optical path length difference generation part.

FIG. 4 is a partial enlarged view of the division lens part 62 and the optical path length difference generation part 61. The division lens part 62 includes a plurality of lenses 620 (hereinafter, referred to as "element lenses 620") that are densely arranged with a fixed pitch in a direction (here, the X direction) that is perpendicular to the optical axis J1 of the irradiation optical system 5 and along the light source arrangement plane. Each element lens 620 is in the shape of a block that is long in the Y direction, and has a first lens surface 621 that is a side surface on the −Z side (the light source unit 40 side) and a second lens surface 622 that is a side surface on the +Z side (the optical path length difference generation part 61 side). When viewed in the Y direction, the first lens surface 621 is a convex surface protruding on the −Z side, and the second lens surface 622 is a convex surface protruding on the +Z side. When viewed in the X direction, each element lens 620 has a rectangular shape (see FIG. 3). In this way, the element lenses 620 are cylindrical lenses that have power in only the X direction, and the division lens part 62 is generally called a cylindrical lens array (or a cylindrical fly-eye lens).

The first lens surface 621 and the second lens surface 622 have a symmetrical shape relative to a plane perpendicular to the optical axis J1 (i.e., a plane parallel to an XY plane). The first lens surface 621 is arranged at the focal point of the second lens surface 622, and the second lens surface 622 is arranged at the focal point of the first lens surface 621. In other words, the first lens surface 621 and the second lens surface 622 have the same focal length. The parallel light incident on the element lenses 620 converges on the second lens surface 622. The plurality of element lens 620 stacked in the X direction may be formed as an integral member, or may be separately formed and bonded together.

When viewed in the Y direction, the light incident on the division lens part 62 is divided in the X direction by the plurality of element lenses 620. At this time, the parallel light from each light source part 4 enters the first lens surface 621 of each element lens 620 so that images of the plurality of light sources 41 are formed in the vicinity of the second lens surface 622. The light (a plurality of light fluxes) divided by the element lenses 620 is emitted from the second lens surfaces 622 so that the principal rays are parallel to the optical axis J1 (Z direction). The light fluxes emitted from the respective element lenses 620 enter the optical path length difference generation part 61 while spreading out.

The optical path length difference generation part 61 includes a plurality of transparent parts 610 that are densely arranged with a fixed pitch in a direction (here, the X direction) that is perpendicular to the optical axis J1 and along the light source arrangement plane. In the example in FIG. 2, the number of transparent parts 610 of the optical path length difference generation part 61 is smaller by one than the number of element lenses 620 of the division lens part 62. The array pitch of the transparent parts 610 is equal to that of the element lenses 620. Each transparent part 610 is (ideally) in the shape of a block that has surfaces perpendicular to the X, Y, and Z directions. The transparent parts 610 arranged in a row in the X direction have the same X-direction length and the same Y-direction length, but have different lengths in the Z direction, i.e., in the direction along the optical axis J1. Thus, the transparent parts 610 have different optical path lengths. In the optical path length difference generation part 61 in FIG. 2, the transparent part 610 that is closer to the +X side among the plurality of transparent parts 610 has a smaller Z-direction length. The lengths of the transparent parts 610 in the direction of the optical axis J1 do not necessarily have to increase (or decrease) in order in the X direction, and may form a randomly irregular shape. In the present embodiment, the transparent parts 610 of the optical path length difference generation part 61 are made of the same material, and formed as an integral member. Alternatively, the transparent parts 610 of the optical path length difference generation part 61 may be separately formed and bonded together.

The division lens part 62 and the optical path length difference generation part 61 are disposed close to each other in the Z direction, and the plurality of element lenses 620, excluding the element lens 620 furthest to the +X side, and the plurality of transparent parts 610 are respectively arranged at the same position in the X direction. Thus, the light fluxes that have passed through these element lenses 620 respectively enter the transparent parts 610. To be more specific, the light flux emitted from the second lens surface 622 (see FIG. 4) of each element lens 620 enters an entrance surface 611, which is the −Z side surface of the transparent part 610 disposed at the same position in the X direction. This light flux passes through the transparent part 610 and is emitted from an exit surface 612, which is the +Z side surface of the transparent part 610. Note that the light flux that has passed through the element lens 620 located furthest to the +X side does not pass through any of the transparent parts 610.

In actuality, the width, in the X direction, of the light flux emitted from the exit surface 612 of each transparent part 610 becomes smaller than the width, in the X direction, of the transparent part 610, i.e., the array pitch of the transparent part 610. This prevents or suppresses the light flux from falling on the edges of the transparent part 610 (i.e., the edges in the X direction, principally the edges of the entrance surface 611 and the exit surface 612). Note that the optical path length difference generation part 61 may include the same number of transparent parts 610 as the number of element lenses 620 of the division lens part 62. In this case, the light fluxes that have passed through the plurality of (all) element lenses 620 will respectively enter the plurality of transparent parts 610.

As illustrated in FIGS. 2 and 3, the light flux that has passed through each transparent part 610 travels toward the light condensing part 63. The light condensing part 63 includes three cylindrical lenses 631, 632, and 633. The cylindrical lens 632 has positive power in the X direction, which is the direction of arrangement of the element lens 620, but does not have power in the Y direction, which is perpendicular to the optical axis J1 and the above arrangement direction. The cylindrical lens 632 is disposed at a position spaced on the +Z side by its focal length $f_C$ from the second lens surfaces 622 of the element lenses 620. In other words, the second lens surface 622 of each element lens 620 is disposed at a front focal position (front focal point) of the cylindrical lens 632. The irradiation plane 320 on the optical axis J1 is disposed at a position spaced on the +Z side by the focal length $f_C$ of the cylindrical lens 632 from the cylindrical lens 632. In other words, the irradiation plane 320 is disposed at a back focal position of the cylindrical lens 632.

The cylindrical lens 631 has negative power in the Y direction, but does not have power in the X direction. The cylindrical lens 631 is disposed between the optical path length difference generation part 61 and the cylindrical lens 632. The cylindrical lens 633 has positive power in the Y direction, but does not have power in the X direction. The cylindrical lens 633 is disposed between the cylindrical lens 632 and the irradiation plane 320. As will be described later, when viewed in the X direction, the cylindrical lens 631 causes the incident light to diverge, and the cylindrical lens 633 cause the incident light to converge. Hereinafter, the cylindrical lens 631 is referred to as the "diverging lens 631," and the cylindrical lens 633 is referred to as the "converging lens 633."

Among the plurality of optical elements of the irradiation optical system 5, the converging lens 633, which is closest to the irradiation plane 320, is disposed at a position spaced on the −Z side by a predetermined distance $f_b$ (hereinafter, referred to as a "back focus $f_b$") from the irradiation plane 320. When considering only the Y direction, a composite focal length (combined focal length) fi, resulting from the diverging lens 631 and the converging lens 633 is shorter than the back focus $f_b$. The composite focal length $f_L$ can be regarded as the focal length of the light condensing part 63 when considering only the Y direction, and is referred to as the "focal length $f_L$ of the light condensing part 63 with respect to the Y direction" in the following description.

Here, the focal length $f_L$ of the light condensing part 63 with respect to the Y direction can be expressed by Expression 1, where $f_{L1}$ is the focal length of the diverging lens 631, $f_{L2}$ is the focal length of the converging lens 633, and $d_L$ is the distance between the diverging lens 631 and the converging lens 633. Similarly, the back focus $f_b$ can be expressed by Expression 2. Note that the thickness of each lens is disregarded in Expressions 1 and 2.

$$f_L = f_{L1} f_{L2}/(f_{L1}+f_{L2}-d_L)$$ Expression 1

$$f_b = f_{L2}(f_{L2}-d_L)/(f_{L1}+f_{L2}-d_L)$$ Expression 2

As is clear from Expressions 1 and 2, the focal length $f_L$ of the light condensing part 63 with respect to the Y direction and the back focus $f_b$ are determined by only the focal length $f_{L1}$ of the diverging lens 631, the focal length $f_{L2}$ of the converging lens 633, and the distance di, between the two lenses.

Figure 5:
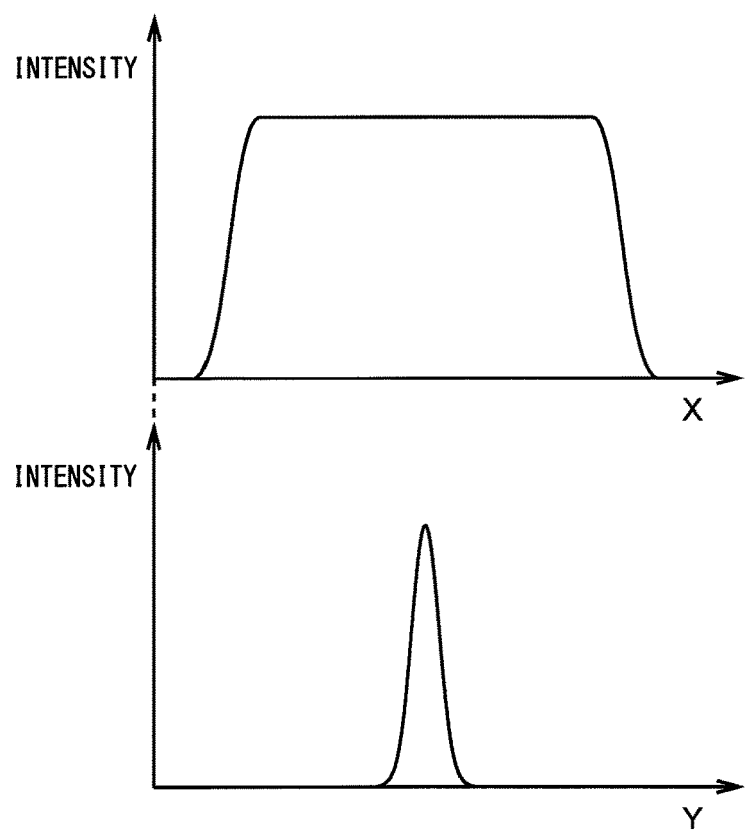
FIG. 5 illustrates the intensity distribution of light on an irradiation plane.

When viewed in the Y direction as illustrated in FIG. 2, the light fluxes emitted from the element lenses 620 are collimated by the cylindrical lens 632 and superimposed on one another on the irradiation plane 320. In other words, irradiation regions 50 of the light emitted from the element lens 620 (i.e., the plurality of light fluxes that have passed through the transparent parts 610) wholly overlap. The irradiation regions 50 are indicated by a bold solid line in FIGS. 2 and 3 and have a fixed width in the X direction. As described previously, the light fluxes emitted from the element lens 620 pass through the different transparent parts 610. This produces differences between the optical path lengths of the light fluxes that travel from the division lens part 62 to the irradiation plane 320, thus suppressing (or preventing) the appearance of interference fringes in the irradiation plane 320 due to the interference of the light divided by the element lenses 620. In other words, the intensity distribution, in the X direction, of light on the irradiation plane 320 becomes approximately uniform as illustrated in the upper section of FIG. 5. For each combination of two transparent parts 610 out of the plurality of transparent parts 610, a difference between the optical path lengths of the light fluxes that have passed through the two transparent parts 610 is preferably greater than or equal to the coherence length of the laser light emitted from the light source part 4.

When viewed in the X direction as illustrated in FIG. 3, the light incident on the division lens part 62 from the light source unit 40 passes as parallel light along the optical axis J1 (precisely, parallel light that is parallel to a ZX plane) through the division lens part 62 and the optical path length difference generation part 61 and is guided to the diverging lens 631. The diverging lens 631, which has negative power in only the Y direction, causes this parallel light to diverge in the Y direction. The divergent light from the diverging lens 631 passes through the cylindrical lens 632 and enters the converging lens 633. The converging lens 633, which has positive power in only the Y direction, causes the divergent light from the diverging lens 631 to converge on the irradiation plane 320. Thus, the irradiation region 50 of the light from each element lens 620 forms a line that extends in the X direction on the irradiation plane 320. This obtains linear illumination light that is the collection of the light fluxes that have passed through the element lenses 620 and whose cross section on the irradiation plane 320 (i.e., cross section of light fluxes that is perpendicular to the optical axis J1; the same applies below) forms a line that extends in the X direction. The intensity distribution, in the Y direction, of the linear illumination light is illustrated in the lower section of FIG. 5.

Figure 6:
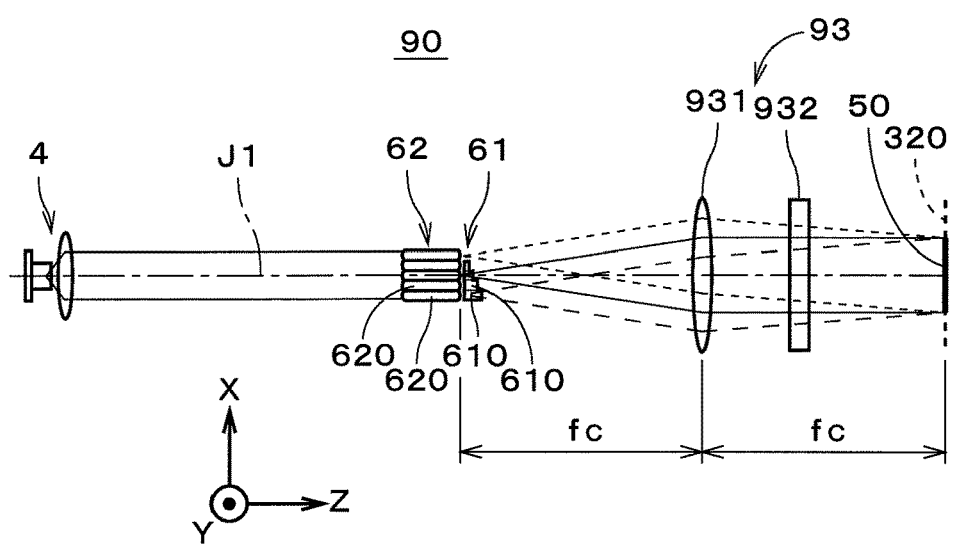
FIG. 6 illustrates a configuration of a light irradiation apparatus according to a comparative example.
Figure 7:
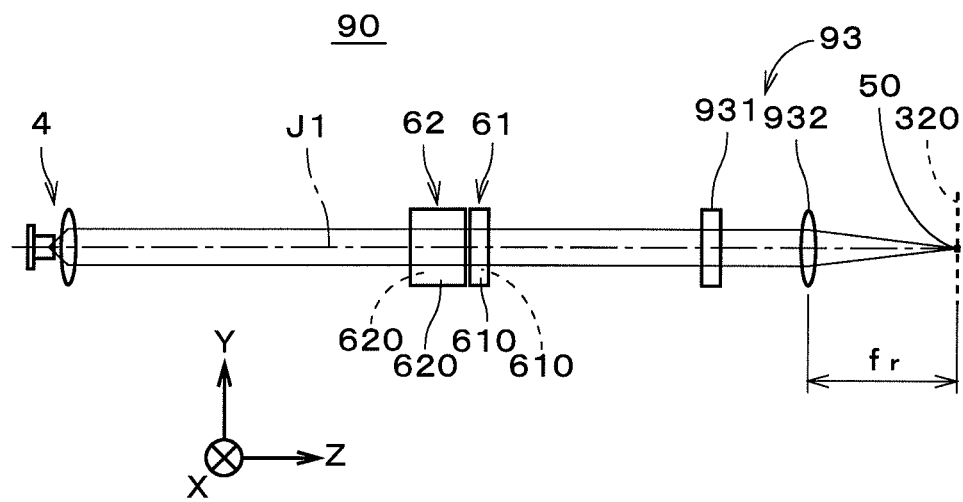
FIG. 7 illustrates a configuration of the light irradiation apparatus according to the comparative example.

Now, a light irradiation apparatus according to a comparative example will be described. FIGS. 6 and 7 illustrate a configuration of a light irradiation apparatus 90 according to a comparative example and correspond respectively to FIGS. 2 and 3. The light irradiation apparatus 90 of the comparative example includes a light source part 4, a division lens part 62, an optical path length difference generation part 61, and a light condensing part 93. The configurations of the light source part 4, the division lens part 62, and the optical path length difference generation part 61 are the same as those of the light irradiation apparatus 31 in FIGS. 2 and 3. The light condensing part 93 includes two cylindrical lenses 931 and 932. The position of the cylindrical lens 931 relative to the irradiation plane 320 is the same as that of the cylindrical lens 632 in FIGS. 2 and 3. On the other hand, the cylindrical lens 932, which is closest to the irradiation plane 320, is disposed at a position on the −Z side by its focal length $f_r$ from the irradiation plane 320. The focal length $f_r$ of the cylindrical lens 932 is the focal length of the light condensing part 93 with respect to the Y direction.

Figure 8:
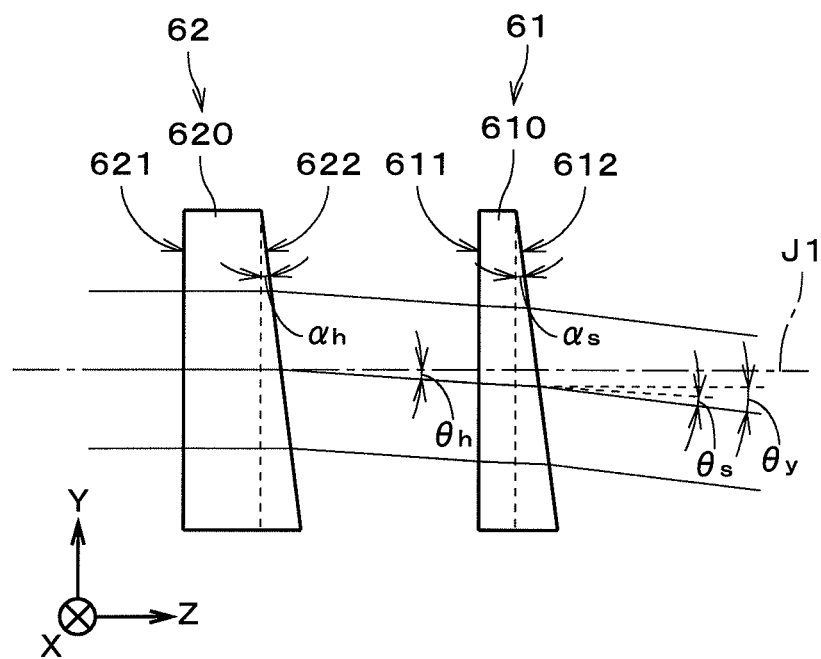
FIG. 8 illustrates the division lens part and the optical path length difference generation part.

As illustrated in FIG. 8, manufacturing limitations of the element lenses 620 of the division lens part 62 result in the angles $\alpha_h$ (also referred to as "wedge angles" and hereinafter also referred to as "parallelisms") of the second lens surfaces 622 relative to the first lens surfaces 621 when viewed in the X direction not being zero, and the parallelism being different for each element lens 620. Similarly, manufacturing limitations of the transparent parts 610 of the optical path length difference generation part 61 result in the angles $\alpha_s$ of the exit surfaces 612 relative to the entrance surfaces 611 when viewed in the X direction not being zero, and the parallelism being different for each transparent part 610. Although the parallelism can be controlled to be in the range of several seconds to several tens of seconds by manufacturing the division lens part 62 and the optical path length difference generation part 61 with higher accuracy, the manufacturing costs of the division lens part 62 and the optical path length difference generation part 61 will increase. For convenience of illustration, FIG. 8 illustrates the division lens part 62 and the optical path length difference generation part 61 as being spaced from each other in the Z direction.

In the example in FIG. 8, when viewed in the X direction, the travel direction of the light emitted from the second lens surface 622 of the element lens 620 is inclined by an angle $\theta_h$ to the travel direction of the light incident on the first lens surface 621, which is assumed to be parallel to a ZX plane, and the travel direction of the light emitted from the exit surface 612 of the transparent part 610 is inclined by an angle $\theta_s$ to the travel direction of the light incident on the entrance surface 611. Thus, the travel direction of the light that has passed through the element lens 620 and the transparent part 610 is inclined by an angle $\theta_y$ ($\theta_y = \theta_h + \theta_s$) to the travel direction of the light incident on the first lens surface 621 of the element lens 620, i.e., to the optical axis J1. The above angle $\theta_h$ is expressed as $(n_h-1)\alpha_h$, where $n_h$ is the refractive index of the element lens 620, and the above angle $\theta_s$ is expressed as $(n_s-1)\alpha_s$, where $n_s$ is the refractive index of the transparent part 610. Note that the refractive index of air is assumed to be 1, and the angles $\alpha_n$, $\alpha_s$, $\theta_h$, and $\theta_s$ are assumed to be sufficiently small.

Figure 9:
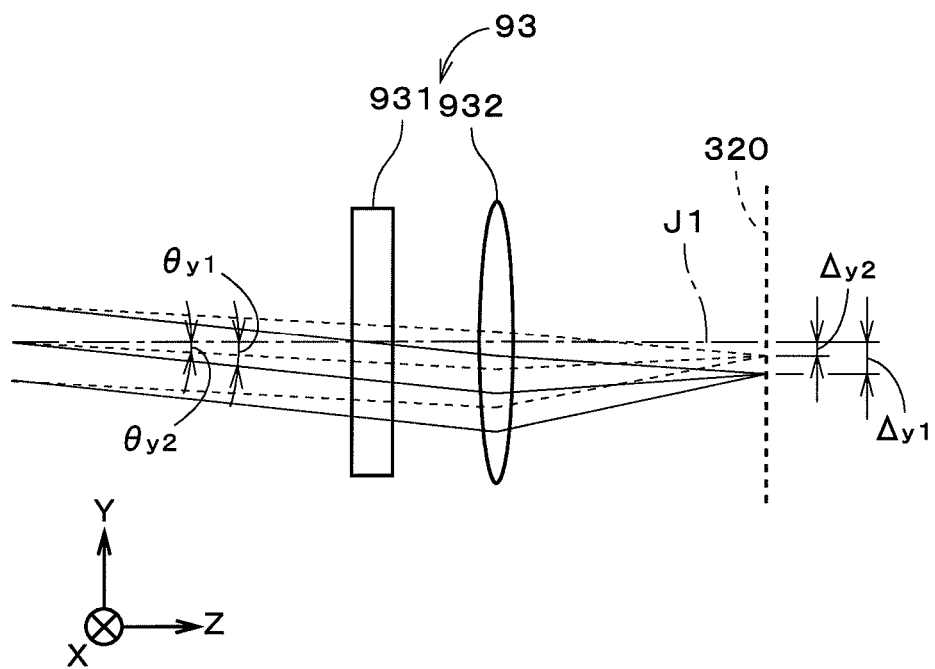
FIG. 9 illustrates light condensing positions on the irradiation plane.
Figure 10:
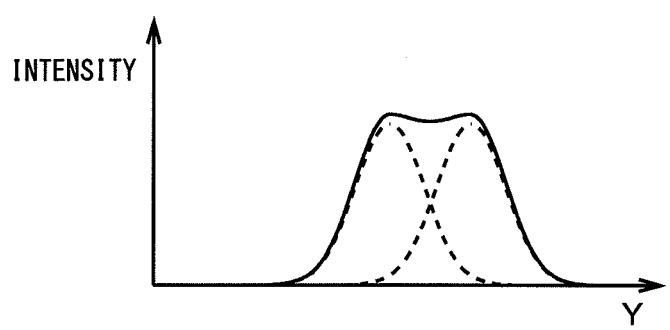
FIG. 10 illustrates the intensity distribution of light on the irradiation plane.

In the light irradiation apparatus 90 of the comparative example in FIG. 7, when a plurality of light fluxes that respectively have passed through the plurality of element lenses 620 enter the light condensing part 93 at different angles $\theta_{y1}$ and $\theta_{y2}$ relative to the optical axis J1 due to variations of the parallelisms of the element lenses 620 and the transparent parts 610 as illustrated in FIG. 9, the light condensing positions of the plurality of light fluxes on the irradiation plane 320 are shifted from one another in the Y direction. In FIG. 9, the distances of the light condensing positions of the light fluxes from the optical axis J1 are indicated by $\Delta_{y1}$ and $\Delta_{y2}$. Such shifts in the light condensing positions of the light fluxes increase the width in the Y direction of the linear illumination light, which is the collection of the light fluxes, on the irradiation plane 320. In actuality, the profile of the intensity distribution, in the Y direction, of the linear illumination light becomes deformed as illustrated in FIG. 10 as compared with that of the intensity distribution in the lower section of FIG. 5.

Here, the distance $\Delta_y$, in the Y direction, of the light condensing position of each light flux from the optical axis J1 on the irradiation plane 320 (hereinafter simply referred to as the "shift amount of the light condensing position") can be expressed by Expression 3, using the angle $\theta_y$ (hereinafter, referred to as the "incident angle in the light condensing part") of the travel direction of the light flux incident on the light condensing part 93 relative to the optical axis J1, and the focal length $f_r$ of the light condensing part 93 with respect to the Y direction. In Expression 3, the incident angle $\theta_y$ in the light condensing part is assumed to be sufficiently small.

$$\Delta_y = f_r \cdot \theta_y = f_r((n_h-1)\alpha_h + (n_s-1)\alpha_s) \qquad \text{Expression 3}$$

By reducing the shift amounts $\Delta_y$ of the light condensing positions of the plurality of light fluxes, it is possible to suppress deformation of the profile of the intensity distribution, in the Y direction, of the linear illumination light. As can be seen from Expression 3, the shift amount $\Delta_y$ of the light condensing position can be expressed as the product of the focal length $f_r$ of the light condensing part 93 with respect to the Y direction and the incident angle $\theta_y$ in the light condensing part. Thus, the shift amount $\Delta_y$ of the light condensing position can be reduced by reducing at least one of the focal length $f_r$ of the light condensing part 93 with respect to the Y direction and the incident angle $\theta_y$ in the light condensing part.

In the light irradiation apparatus 31 illustrated in FIGS. 2 and 3, the light condensing part 63 includes the diverging lens 631 for causing light fluxes incident as parallel light when viewed in the X direction to diverge in the Y direction, and the converging lens 633 for causing the light from the diverging lens 631 to converge on the irradiation plane 320. This configuration allows the focal length $f_L$ of the light condensing part 63 with respect to the Y direction to be shorter than the focal length $f_r$ of the light condensing part 93 with respect to the Y direction according to the comparative example, even when the back focus $f_b$ is equal to or longer than that of the light irradiation apparatus 90 of the comparative example. In other words, a design can be readily achieved in which the focal length $f_L$ of the light condensing part 63 with respect to the Y direction is reduced while the back focus $f_b$ is relatively long. Consequently, it is possible to suppress shifts in the light condensing positions of the plurality of light fluxes on the irradiation plane 320 due to variations of the parallelisms of the element lenses 620 and the parallelisms of the transparent parts 610, and to thereby irradiate the irradiation plane 320 with preferable linear illumination light. In addition, high-accuracy pattern drawing is possible with the drawing apparatus 1 including the light irradiation apparatus 31. Note that the light irradiation apparatus 31 can be regarded as being obtained by replacing the cylindrical lens 932 of the light condensing part 93 of the comparative example with the two cylindrical lenses 631 and 633.

The light irradiation apparatus 31 in FIG. 2 emits laser light from the plurality of light source parts 4 toward the division lens part 62. This produces higher-strength (intensity) linear illumination light than in the light irradiation apparatus 90 of the comparative example that uses only a single light source part 4.

Incidentally, the light irradiation apparatus 31 in FIGS. 2 and 3 will have higher numerical aperture (NA) on the image side than the light irradiation apparatus 90 of the comparative example when the back focus $f_b$ is equal to that in the light irradiation apparatus 90 of the comparative example. Next is a description of a light irradiation apparatus 31 in which the focal length of the light condensing part 63 with respect to the Y direction is shorter than that in the light irradiation apparatus 90 of the comparative example while NA on the image side is the same as that in the light irradiation apparatus 90 of the comparative example.

Figure 11:
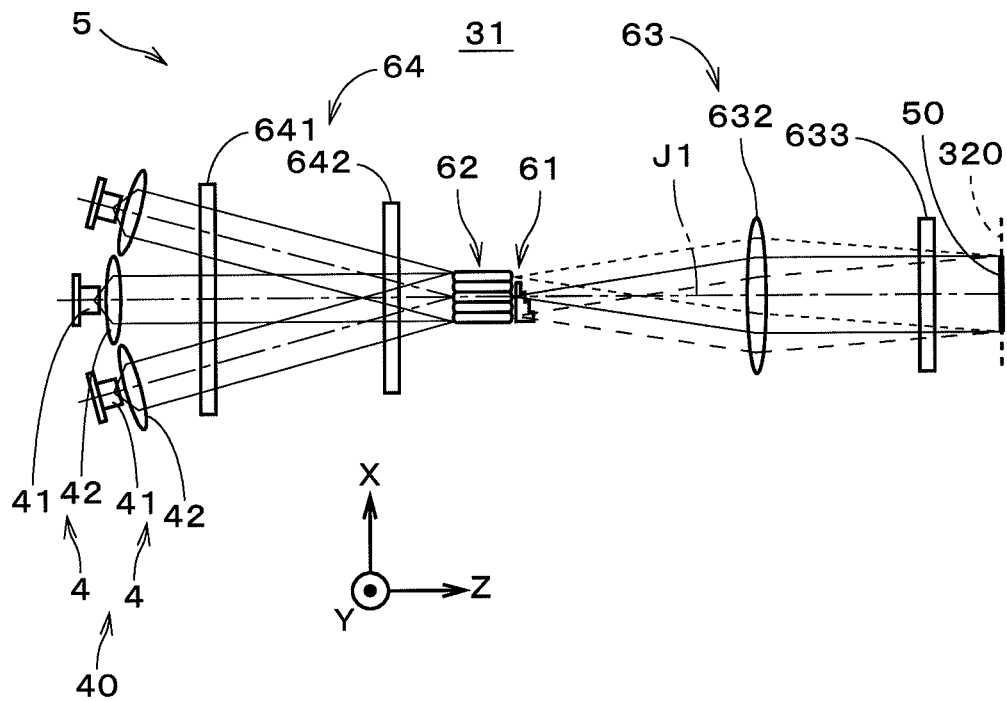
FIG. 11 shows another example of the light irradiation apparatus.
Figure 12:
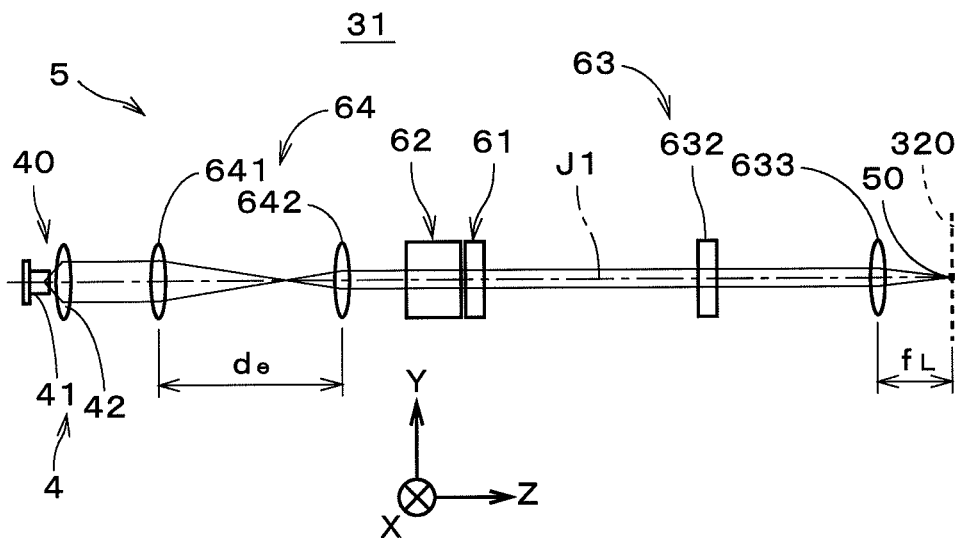
FIG. 12 shows another example of the light irradiation apparatus.

FIGS. 11 and 12 show another example of the light irradiation apparatus 31. FIG. 11 illustrates a configuration of the light irradiation apparatus 31 when viewed in the Y direction, and FIG. 12 illustrates the configuration of the light irradiation apparatus 31 when viewed in the X direction. The light irradiation apparatus 31 in FIGS. 11 and 12 differs from that in FIGS. 2 and 3 in that the diverging lens 631 is omitted, and a width adjustment part 64 is added to the irradiation optical system 5. The other constituent elements are the same as those of the light irradiation apparatus 31 in FIGS. 2 and 3, and the same constituent elements are denoted by the same reference numerals.

As illustrated in FIGS. 11 and 12, the width adjustment part 64 is provided between the light source unit 40 and the division lens part 62. The width adjustment part 64 is a beam expander for changing the width, in the Y-direction, of incident laser light, and includes two cylindrical lenses 641 and 642. The two cylindrical lenses 641 and 642 both have positive power in the Y direction, but do not have power in the X direction. A distance $d_e$ between the two cylindrical lenses 641 and 642 can be expressed as $(f_{e1}+f_{e2})$, where $f_{e1}$ is the focal length of the cylindrical lens 641 and $f_{e2}$ is the focal length of the cylindrical lens 642. The focal length $f_{e1}$ of the cylindrical lens 641 disposed on the light source unit 40 side is greater than the focal length $f_{e2}$ of the cylindrical lens 642 disposed on the division lens part 62 side.

As described previously, collimated laser light is incident on the irradiation optical system 5 from each light source part 4. In the irradiation optical system 5, the width adjustment part 64 is disposed furthest to the light source unit 40 side, and the collimated laser light enters the cylindrical lens 641 of the width adjustment part 64. At this time, when viewed in the X direction as illustrated in FIG. 12, the laser light enters the cylindrical lens 641 as parallel light along the optical axis J1 (more precisely, parallel light that is parallel to a ZX plane) and is emitted from the cylindrical lens 642 as parallel light along the optical axis J1. The width, in the Y direction, of the parallel light emitted from the cylindrical lens 642 is smaller than the width, in the Y direction, of the parallel light incident on the cylindrical lens 641.

The parallel light that has passed through the width adjustment part 64 passes through the division lens part 62, the optical path length difference generation part 61, and the cylindrical lens 632 of the light condensing part 63 without being subject to a lens function in the Y direction, and then enters the converging lens 633. The converging lens 633 causes this parallel light to converge in the Y direction and to condense on the irradiation plane 320. Note that the optical path when viewed in the Y direction is the same as that in the light irradiation apparatus 31 in FIG. 2.

As described above, the light irradiation apparatus 31 in FIGS. 11 and 12 includes the width adjustment part 64 for changing the beam width in only the Y direction so that, when viewed in the X direction, the width, in the Y direction, of the parallel light incident on the light condensing part 63 becomes smaller than the width, in the Y direction, of the laser light incident on the irradiation optical system 5 from the light source part 4.

It is assumed here that the NA on the image side of the light irradiation apparatus 31 in FIG. 12 is equal to that of the light irradiation apparatus 90 of the comparative example in FIG. 7. In this case, the focal length $f_L$ of the light condensing part 63 with respect to the Y direction (here, the focal length of the converging lens 633) is expressed as M times the focal length $f_r$ of the light condensing part 93 with respect to the Y direction according to the comparative example, where M is the reduction ratio in the Y direction of the width adjustment part 64 (M is less than one). In other words, the focal length $f_L$ of the light condensing part 63 with respect to the Y direction is shorter than the focal length $f_r$ of the light condensing part 93 with respect to the Y direction. Note that the reduction ratio M in the Y direction of the width adjustment part 64 depends on the focal lengths $f_{e1}$ and $f_{e2}$ of the cylindrical lenses 641 and 642.

Thus, the light irradiation apparatus 31 in FIG. 12 can readily achieve a design in which the focal length of the light condensing part 63 with respect to the Y direction is reduced while the NA on the image side is equal to that of the light irradiation apparatus 90 of the comparative example. Consequently, it is possible to suppress the shift (shift in the Y direction) in the light condensing positions of the plurality of light fluxes on the irradiation plane 320.

Alternatively, the light irradiation apparatus 31 in FIG. 11 may include the width adjustment part 64 for each of the plurality of light source parts 4. In this case, the cylindrical lenses 641 and 642 can be replaced with two lenses that have power in both of the X and Y directions. The two lenses of such a width adjustment part 64 constitute a double (both side) telecentric optical system. As another alternative, the cylindrical lenses 641 and 642 of the width adjustment part 64 may be provided between the optical path length difference generation part 61 and the cylindrical lens 633. These variations are also possible with other light irradiation apparatuses 31 including the width adjustment part 64.

Figure 13:
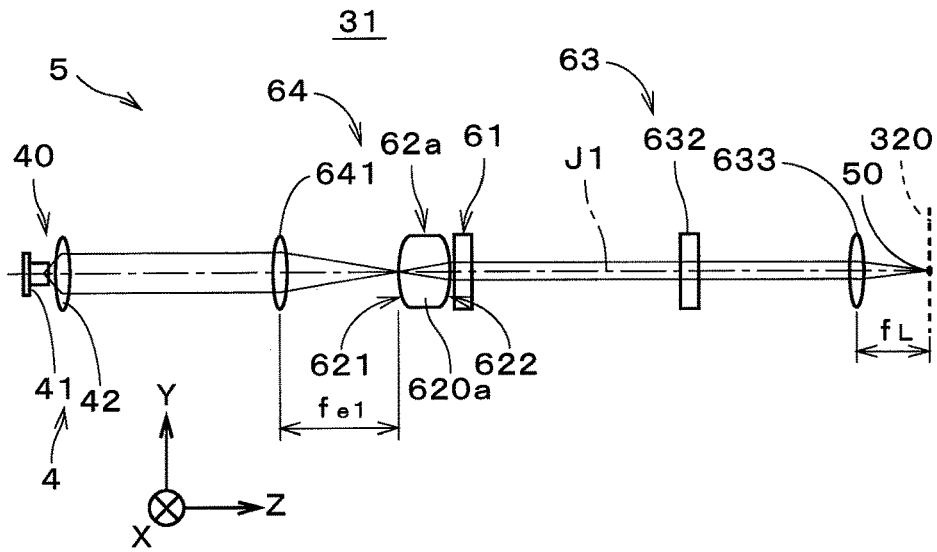
FIG. 13 shows another example of the light irradiation apparatus.

The light irradiation apparatus 31 may implement part of the function of the width adjustment part 64 with a division lens part. More specifically, as illustrated in FIG. 13, both of the first lens surface 621 and the second lens surface 622 of each element lens 620a of a division lens part 62a form part of spherical surfaces, and the cylindrical lens 642 of the light irradiation apparatus 31 in FIG. 12 is omitted. Moreover, the first lens surfaces 621 of the element lenses 620a are disposed at a position spaced by the focal length $f_{e1}$ of the cylindrical lens 641 from the cylindrical lens 641. In the division lens part 62a as well, the first lens surface 621 of each element lens 620a is disposed at the focal point of the second lens surface 622, and the second lens surface 622 is disposed at the focal point of the first lens surface 621. In other words, the first lens surface 621 and the second lens surface 622 have the same focal length.

When viewed in the X direction, the laser light from the light source parts 4 enters the cylindrical lens 641 as parallel light along the optical axis J1 (more precisely, parallel light that is parallel to a ZX plane). The light emitted from cylindrical lens 641 converges on the first lens surfaces 621 of the element lenses 620a and travels toward the second lens surfaces 622 while spreading out within the element lenses 620a. Then, parallel light is emitted along the optical axis J1 from the second lens surfaces 622. The width, in the Y direction, of the parallel light emitted from the element lenses 620a is smaller than the width, in the Y direction, of the parallel light incident on the cylindrical lens 641. The parallel light emitted from the element lenses 620a enters the converging lens 633 via the optical path length difference generation part 61 and the cylindrical lens 632 and converges on the irradiation plane 320.

As described above, the light irradiation apparatus 31 in FIG. 13 is configured such that each element lens 620a of the division lens part 62a has a spherical surface as the second lens surface 622, and the second lens surfaces 622 serve as part of the width adjustment part 64. This configuration allows parallel light having a small width in the Y direction (parallel light when viewed in the X direction) to be incident on the light condensing part 63 disposed between the division lens part 62a and the irradiation plane 320, and therefore can readily reduce the focal length $f_L$ of the light condensing part 63 with respect to the Y direction. It is also possible to reduce the number of constituent elements as compared to the light irradiation apparatus 31 in FIG. 12.

Figure 14:
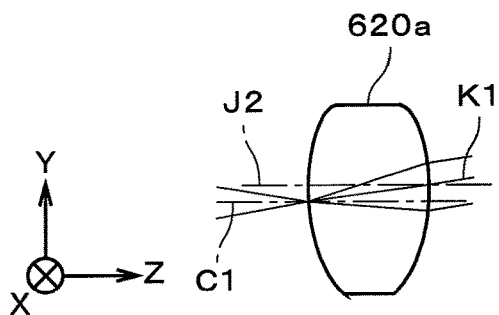
FIG. 14 illustrates an element lens.

Incidentally, for each element lens 620a having spherical surfaces as its first and second lens surfaces 621 and 622, a center line C1 of the element lens 620a may be shifted from an optical axis J2 that passes through the focal point of the element lens 620a due to errors in manufacture as illustrated in FIG. 14 (this phenomenon can also be regarded as "decentering"). When viewed in the X direction, if such an element lens 620a is disposed such that its center line C1 matches the optical axis J1 of the irradiation optical system 5, a path K1 of light incident along the optical axis J1 will be inclined relative to the optical axis J1. In this case, the light condensing position of the light flux on the irradiation plane 320 is shifted in the Y direction from the optical axis J1 and accordingly the profile of the intensity distribution, in the Y direction, of the linear illumination light becomes deformed, as in the case where the parallelism of the element lens 620 serving as a cylindrical lens decreases.

Figure 15:
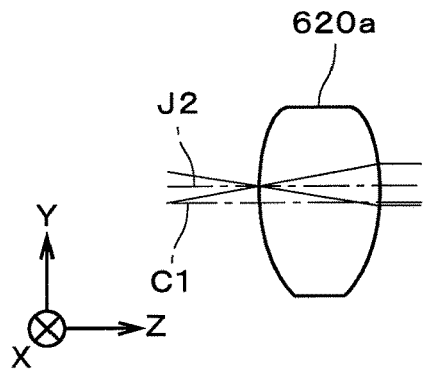
FIG. 15 illustrates an element lens.

On the other hand, in the preferred light irradiation apparatus 31, the position of each element lens 620a is adjusted in the manufacture of the division lens part 62a such that the optical axis J2 rather than the center line C1 of the element lens 620a matches the optical axis J1 of the irradiation optical system 5 as illustrated in FIG. 15. This reduces the possibility that the light condensing positions of the light fluxes that have passed through the element lenses 620a may be shifted in the Y direction from the optical axis J1 on the irradiation plane 320. The light irradiation apparatus 31 including such a division lens part 62a can limit the factors that cause shifts in the light condensing positions of light fluxes on the irradiation plane 320 to variation in the parallelism of the transparent parts 610 and therefore can further suppress shifts in the light condensing positions of light fluxes on the irradiation plane 320.

The light irradiation apparatus 31 may also be configured such that the first lens surfaces 621 of the element lenses 620a serve as part of the width adjustment part 64. In this case, the cylindrical lens 642 is provided on the +Z side of the element lens 620a. When viewed in the X direction, the parallel light incident on the first lens surfaces 621 of the element lenses 620a converges on the second lens surfaces 622. The light emitted from the second lens surfaces 622 is collimated by the cylindrical lens 642 and enters the light condensing part 63. At this time, the width, in the Y direction, of the parallel light incident on the light condensing part 63 becomes smaller than the width, in the Y direction, of the laser light incident on the irradiation optical system 5 from the light source part 4 like the above.

The light irradiation apparatus 31 in FIGS. 11 to 13 can make the NA on the image side equal to that in the light irradiation apparatus 90 of the comparative example, but in this case, the back focus becomes shorter than that in the light irradiation apparatus 90 of the comparative example. Next is a description of a light irradiation apparatus 31 that can make the focal length of the light condensing part 63 with respect to the Y direction shorter than that in the light irradiation apparatus 90 of the comparative example while having the same back focus and the same NA on the image side as in the light irradiation apparatus 90 of the comparative example.

Figure 16:
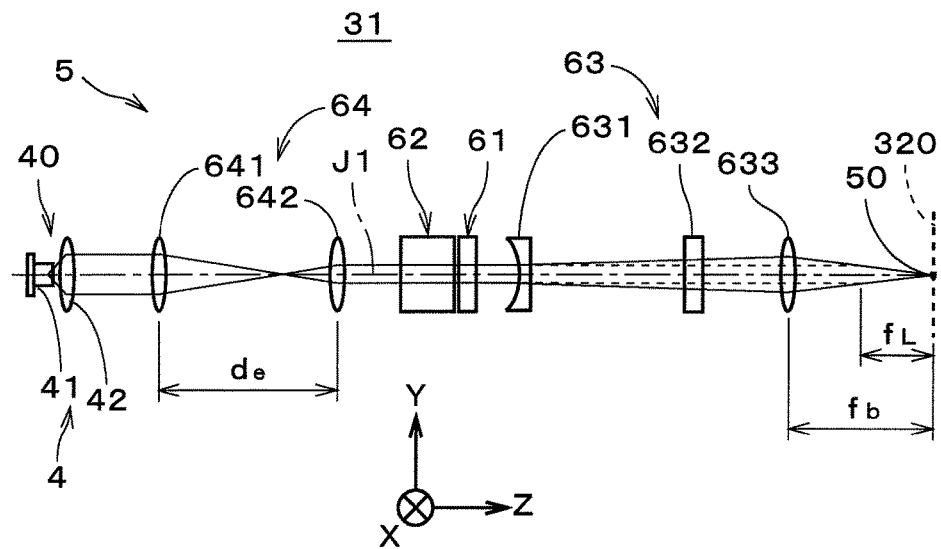
FIG. 16 shows another example of the light irradiation apparatus.

FIG. 16 shows another example of the light irradiation apparatus 31 and illustrates a configuration of the light irradiation apparatus 31 when viewed in the X direction. The light irradiation apparatus 31 in FIG. 16 is obtained by adding the width adjustment part 64 in FIG. 12 to the light irradiation apparatus 31 in FIG. 3. By adjusting the reduction ratio of the width adjustment part 64 and the focal lengths and arrangement of the diverging lens 631 and the converging lens 633, the light irradiation apparatus 31 can make the focal length $f_L$ of the light condensing part 63 with respect to the Y direction shorter than in the light irradiation apparatus 90 of the comparative example, while having the same back focus $f_b$ and the same NA on the image side as in the light irradiation apparatus 90 of the comparative example. Consequently, it is possible to suppress shifts in the light condensing positions of a plurality of light fluxes on the irradiation plane 320. In addition, the drawing apparatus including the light irradiation apparatus 90 of the comparative example can be modified by simply replacing the light irradiation apparatus 90 of the comparative example with the light irradiation apparatus 31 in FIG. 16 to achieve high-precision pattern drawing without significantly changing the design of the drawing apparatus, for example (the same applies to a light irradiation apparatus 31 in FIGS. 17 and 18, which will be described below).

Figure 17:
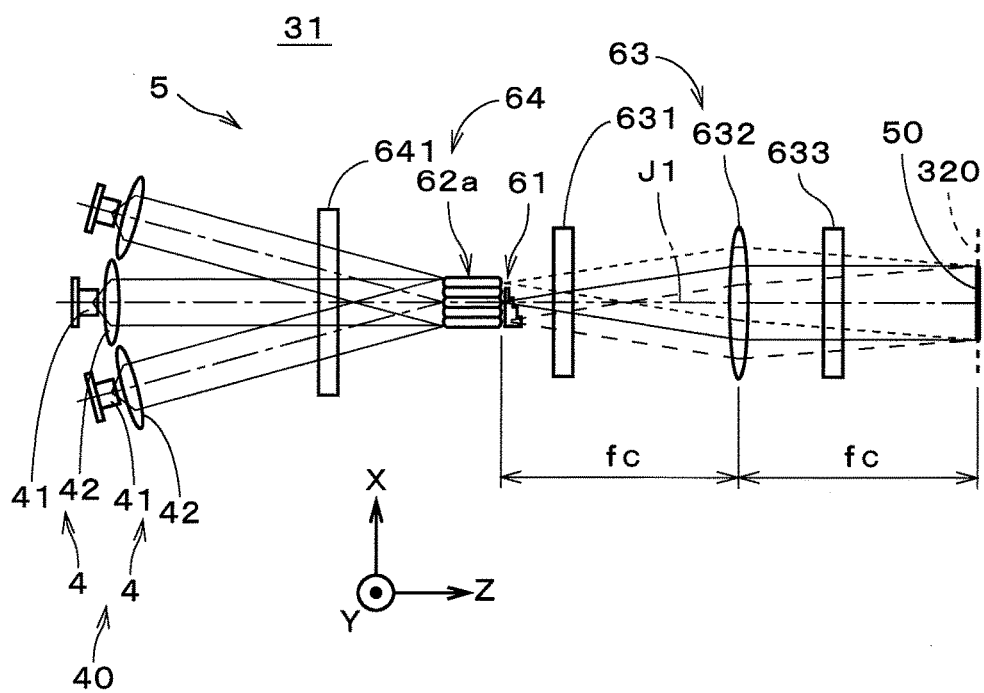
FIG. 17 shows another example of the light irradiation apparatus.
Figure 18:
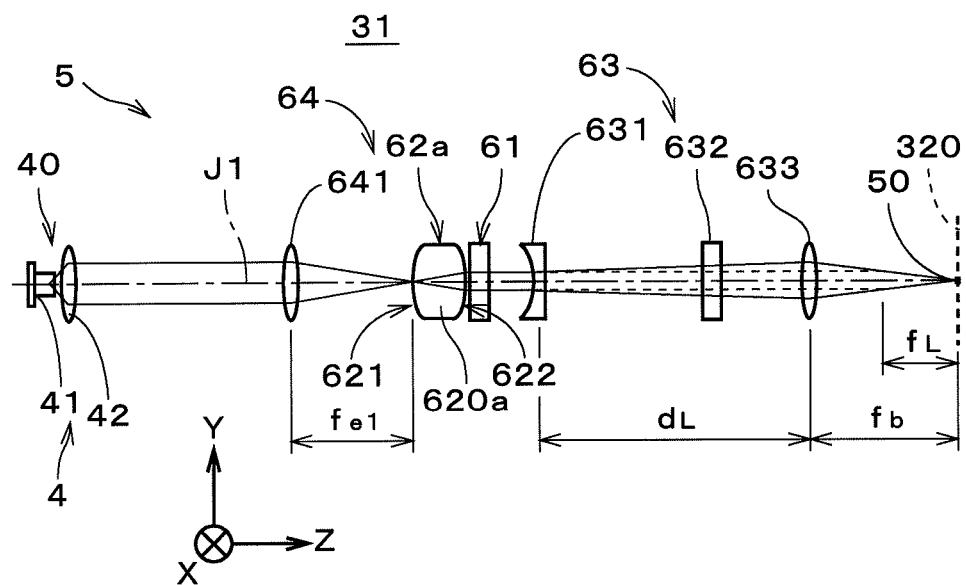
FIG. 18 shows another example of the light irradiation apparatus.

FIGS. 17 and 18 show another example of the light irradiation apparatus 31. FIG. 17 illustrates a configuration of the light irradiation apparatus 31 when viewed in the Y direction, and FIG. 18 illustrates the configuration of the light irradiation apparatus 31 when viewed in the X direction. The light irradiation apparatus 31 in FIGS. 17 and 18 is obtained by adding the diverging lens 631 in FIG. 3 to the light irradiation apparatus 31 in FIG. 13. This configuration allows the focal length $f_L$ of the light condensing part 63 with respect to the Y direction to be shorter than that in the light irradiation apparatus 90 of the comparative example while having the same back focus $f_b$ and the same NA on the image side as in the light irradiation apparatus 90 of the comparative example, similarly to the case of the light irradiation apparatus 31 in FIG. 16. It is also possible to reduce the number of constituent elements as compared to the light irradiation apparatus 31 in FIG. 16. Alternatively, the cylindrical lens 641 of the width adjustment part 64 may be provided individually for each of a plurality of light source parts 4.

The above-described light irradiation apparatuses 31 can be modified in various ways.

The division lens part 62 or 62a does not necessarily have to have a plurality of element lenses 620 or 620a arranged with a fixed pitch in the arrangement direction. For example, the element lenses 620 or 620a may have different widths in the arrangement direction. In this case, the widths, in the arrangement direction, of the plurality of transparent parts 610 of the optical path length difference generation part 61 are also changed so that every transparent part 610 has the same ratio of the width of the transparent part 610 to the width of the element lens 620 or 620a of the division lens part 62 or 62a corresponding to this transparent part 610 in the arrangement direction.

Figure 19:
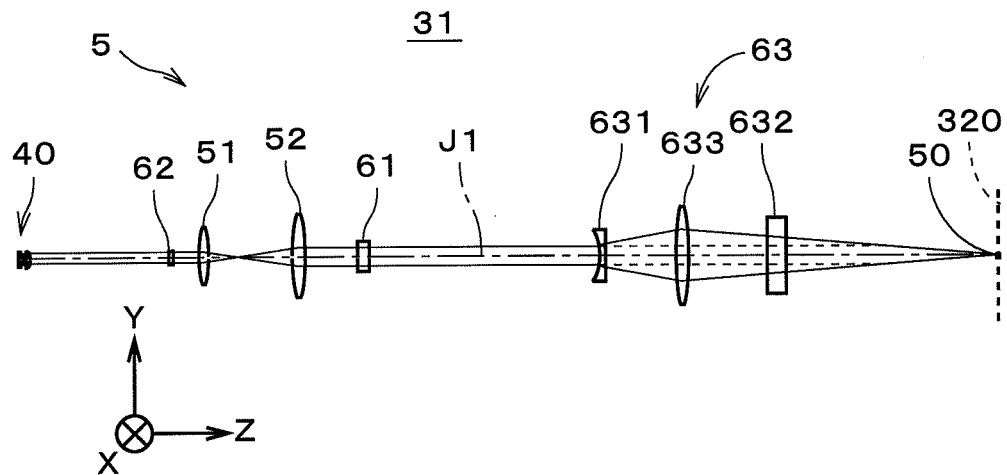
FIG. 19 shows another example of the light irradiation apparatus.

The optical path length difference generation part 61 does not necessarily have to be disposed adjacent to the division lens part 62. For example, lenses 51 and 52 may be provided between the division lens part 62 and the optical path length difference generation part 61 as illustrated in FIG. 19. The lenses 51 and 52 constitute a double telecentric optical system, so that a plurality of light fluxes that have passed through the plurality of element lenses 620 of the division lens part 62 respectively enter the plurality of transparent parts 610 of the optical path length difference generation part 61 via the lenses 51 and 52.

Figure 20:
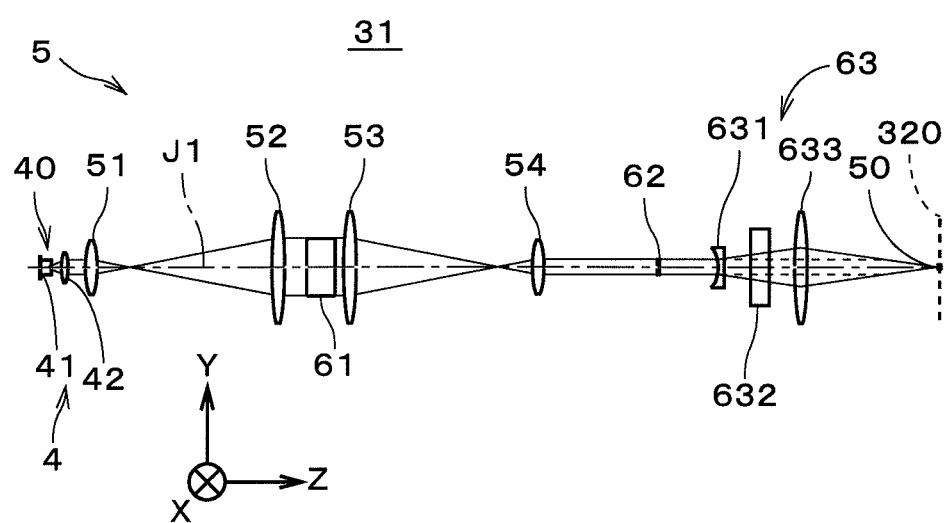
FIG. 20 shows another example of the light irradiation apparatus.

When the light source unit 40 includes only a single light source part 4, the optical path length difference generation part 61 may be disposed between the light source part 4 and the division lens part 62 as illustrated in FIG. 20. The light irradiation apparatus 31 in FIG. 20 includes lenses 51 and 52, which constitute a double telecentric optical system, between the light source part 4 and the optical path length difference generation part 61, and also includes lenses 53 and 54, which constitute a double telecentric optical system, between the optical path length difference generation part 61 and the division lens part 62. A plurality of light fluxes that have passed through the plurality of transparent parts 610 of the optical path length difference generation part 61 pass through the lenses 53 and 54 and respectively enter the plurality of element lenses 620 of the division lens part 62. In other words, the light fluxes traveling toward the plurality of element lenses 620 respectively enter the plurality of transparent parts 610. The provision of the diverging lens 631 and the converging lens 633 allows the light irradiation apparatuses 31 in FIGS. 19 and 20 to readily achieve a design in which the focal length of the light condensing part 63 with respect to the Y direction is reduced. It is, of course, possible to provide the width adjustment part 64 in the light irradiation apparatuses 31 in FIGS. 19 and 20.

Depending on the uniformity of the linear illumination light required in the light irradiation apparatus 31, the optical path length difference generation part 61 may be omitted. In this case as well, the above-described technique of reducing the focal length of the light condensing part 63 with respect to the Y direction is applied because the parallelism of the entrance and exit surfaces of the element lens 620 of the division lens part 62 varies among the element lenses 620 when the element lenses 620 are cylindrical lenses. As described above, the light irradiation apparatus 31 adopts the above-described technique of reducing the focal length of the light condensing part 63 with respect to the Y direction when a plurality of element lenses are a plurality of cylindrical lenses that do not have power in the Y direction or when the irradiation optical system 5 includes a plurality of transparent parts arranged in the X direction and having different optical path lengths (including a case where a plurality of element lenses are a plurality of cylindrical lenses and the irradiation optical system 5 includes a plurality of transparent parts). Note that when a plurality of transparent parts is provided in the apparatus, light fluxes that have passed through a plurality of element lenses or light fluxes that travel toward the element lenses will respectively enter the plurality of transparent parts.

Depending on the design of the light irradiation apparatus 31, the converging lens 633 may be a spherical lens. In this case, the cylindrical lens 632 and the converging lens 633 cooperate to superimpose the irradiation regions 50 of a plurality of light fluxes on one another on the irradiation plane 320. For the same reason, the lens 632 may be a spherical lens. In this case, the lenses 632 and 633 cooperate to cause the light to converge in the Y direction. The composite focal length $f_L$ is expressed as a combination of the three lenses 631, 632, and 633. While the diverging part for causing parallel light to diverge in the Y direction is implemented by the diverging lens 631 having negative power in only the Y direction in the above-described embodiment, a lens having positive power may be provided as a diverging part. In this case as well, the focal length of the light condensing part 63 with respect to the Y direction can be reduced because light that has passed through the lens converges and then diverges in the Y direction. The diverging part may also be implemented by a different optical element such as a cylindrical mirror.

In the drawing apparatus 1, the spatial light modulator 32 disposed on the irradiation plane 320 of the light irradiation apparatus 31 may be a device other than a diffraction grating type light modulator. For example, a spatial light modulator using a group of minute mirrors may be used.

The movement mechanism for moving the irradiation position of light on the substrate 9 may be a different mechanism other than the movement mechanism 22 for moving the stage 21, and may, for example, be a movement mechanism for moving a head that includes the light irradiation apparatus 31, the spatial light modulator 32, and the projection optical system 33 relative to the substrate 9.

An object on which the drawing apparatus 1 draws a pattern may be a substrate other than a semiconductor substrate or a glass substrate, and may be components other than substrates. The light irradiation apparatus 31 may be used in apparatuses other than the drawing apparatus 1.

The configurations of the above-described preferred embodiments and variations may be appropriately combined as long as there are no mutual inconsistencies.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2014-126372 filed in the Japan Patent Office on Jun. 19, 2014 and Japanese Patent Application No. 2015-093302 filed in the Japan Patent Office on Apr. 30, 2015, the entire disclosures of which are incorporated herein by reference.

REFERENCE SIGNS LIST

1 Drawing apparatus
4 Light source part
5 Irradiation optical system
9 Substrate
11 Control part
22 Movement mechanism
31 Light irradiation apparatus
32 Spatial light modulator
33 Projection optical system
50 Irradiation region
62, 62a Division lens part
63 Light condensing part
64 Width adjustment part
320 Irradiation plane
610 Transparent part
620, 620a Element lens
621, 622 Lens surface
631 Diverging lens
633 Converging lens
J1 Optical axis

The invention claimed is:
1. A light irradiation apparatus comprising:
    a light source part for emitting laser light toward a predetermined position; and
    an irradiation optical system disposed at said predetermined position and for guiding the laser light from said light source part along an optical axis to an irradiation plane, wherein said irradiation optical system includes:
a division lens part having a plurality of element lenses arranged in a first direction perpendicular to said optical axis, and for using said plurality of element lenses to divide incident light into a plurality of light fluxes;
an optical path length difference generation part including a plurality of transparent parts arranged in said first direction, said plurality of transparent parts having different optical path lengths, light fluxes that have passed through said plurality of element lenses being respectively incident on said plurality of transparent parts; and
a light condensing part disposed between said optical path length difference generation part and said irradiation plane and for superimposing irradiation regions of said plurality of light fluxes on each other on said irradiation plane, wherein:
said plurality of light fluxes passing through said optical path length difference generation part enter said light condensing part as parallel light when viewed in said first direction, and said light condensing part causes said plurality of light fluxes to converge on said irradiation plane,
said light condensing part includes:
a diverging part on which said parallel light from said optical path length difference generation part is incident and for causing said parallel light to diverge in a second direction perpendicular to said optical axis and said first direction, said diverging part being a cylindrical lens that has negative power in only said second direction; and
a converging lens on which light from said diverging part is incident and that causes said light to converge on said irradiation plane when viewed in said first direction;
each of said irradiation regions forms a line extending in said first direction on said irradiation plane;
said converging lens is closest to said irradiation plane among the foregoing said parts and elements of said irradiation optical system; and
with respect to said second direction, a composite focal length resulting from said diverging part and said converging lens is shorter than a distance between said converging lens and said irradiation plane.

2. The light irradiation apparatus according to claim 1, wherein
collimated laser light is incident on said irradiation optical system from said light source part, and
said irradiation optical system further includes a width adjustment part for making a width, in said second direction, of said parallel light incident on said light condensing part smaller than a width, in said second direction, of said collimated laser light when viewed in said first direction.

3. The light irradiation apparatus according to claim 2, wherein
each of said plurality of element lenses of said division lens part has a spherical lens surface, and
said lens surface serves as part of said width adjustment part.

4. A drawing apparatus comprising:
the light irradiation apparatus according to claim 3;
a spatial light modulator disposed on said irradiation plane of said light irradiation apparatus;
a projection optical system for guiding spatially modulated light emitted from said spatial light modulator onto an object;
a movement mechanism for moving an irradiation position to be irradiated with said spatially modulated light on said object; and
a control part for controlling said spatial light modulator in synchronization with the movement of said irradiation position by said movement mechanism.

5. A drawing apparatus comprising:
the light irradiation apparatus according to claim 2;
a spatial light modulator disposed on said irradiation plane of said light irradiation apparatus;
a projection optical system for guiding spatially modulated light emitted from said spatial light modulator onto an object;
a movement mechanism for moving an irradiation position to be irradiated with said spatially modulated light on said object; and
a control part for controlling said spatial light modulator in synchronization with the movement of said irradiation position by said movement mechanism.

6. A drawing apparatus comprising:
the light irradiation apparatus according to claim 1;
a spatial light modulator disposed on said irradiation plane of said light irradiation apparatus;
a projection optical system for guiding spatially modulated light emitted from said spatial light modulator onto an object;
a movement mechanism for moving an irradiation position to be irradiated with said spatially modulated light on said object; and
a control part for controlling said spatial light modulator in synchronization with the movement of said irradiation position by said movement mechanism.

* * * * *